(12) United States Patent
Naijo

(10) Patent No.: US 9,972,661 B2
(45) Date of Patent: May 15, 2018

(54) ORGANIC LIGHT-EMITTING DISPLAY DEVICE INCLUDING THIN-FILM SOLAR CELL AND METHOD OF MANUFACTURING THE ORGANIC LIGHT-EMITTING DISPLAY DEVICE

(71) Applicant: Samsung Display Co., Ltd., Yongin-si (KR)

(72) Inventor: Tsuyoshi Naijo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/618,658

(22) Filed: Jun. 9, 2017

(65) Prior Publication Data

US 2017/0358630 A1 Dec. 14, 2017

(30) Foreign Application Priority Data

Jun. 9, 2016 (KR) ........................ 10-2016-0071738

(51) Int. Cl.
| H01L 27/28 | (2006.01) |
| H01L 51/52 | (2006.01) |
| H01L 51/50 | (2006.01) |
| H01L 51/44 | (2006.01) |
| H01L 51/42 | (2006.01) |
| H01L 51/00 | (2006.01) |
| H01L 51/56 | (2006.01) |

(52) U.S. Cl.
CPC ........ *H01L 27/288* (2013.01); *H01L 51/0097* (2013.01); *H01L 51/424* (2013.01); *H01L 51/442* (2013.01); *H01L 51/5012* (2013.01); *H01L 51/5056* (2013.01); *H01L 51/5072* (2013.01); *H01L 51/5206* (2013.01); *H01L 51/5221* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| 8,685,780 B2 | 4/2014 | Kim et al. |
| 8,890,128 B2 * | 11/2014 | Liu ...................... H01L 27/288 |
| | | 257/40 |
| 9,165,978 B2 | 10/2015 | Naijo |

(Continued)

FOREIGN PATENT DOCUMENTS

| KR | 10-2010-0099504 | 9/2010 |
| KR | 10-2011-0090310 | 8/2011 |

(Continued)

*Primary Examiner* — Asok K Sarkar
(74) *Attorney, Agent, or Firm* — H.C. Park & Associates, PLC

(57) ABSTRACT

An organic light-emitting display device having an integrated thin-film solar cell includes a substrate, a display disposed in a first area on the substrate to display images and including a first thin-film layer, and a thin-film solar cell disposed in a second area on the substrate to receive sunlight and generate electricity to drive the display and including a second thin-film layer, in which the first thin-film layer and the second thin-film layer include the same thin-film layer extending from the first area to the second area.

21 Claims, 5 Drawing Sheets

(56) References Cited

U.S. PATENT DOCUMENTS

| | | | |
|---|---|---|---|
| 9,614,013 B2* | 4/2017 | Im | H01L 27/3227 |
| 2005/0183764 A1* | 8/2005 | Han | B82Y 10/00 |
| | | | 136/251 |
| 2007/0089784 A1* | 4/2007 | Noh | B82Y 10/00 |
| | | | 136/263 |
| 2007/0102035 A1* | 5/2007 | Yang | G02F 1/133512 |
| | | | 136/244 |
| 2010/0079711 A1* | 4/2010 | Tanaka | G02F 1/13306 |
| | | | 349/116 |
| 2010/0245731 A1* | 9/2010 | Limketkai | G02B 5/201 |
| | | | 349/106 |
| 2012/0091473 A1* | 4/2012 | Lee | H01L 27/288 |
| | | | 257/81 |
| 2012/0105780 A1* | 5/2012 | Jhan | G02F 1/13718 |
| | | | 349/116 |
| 2014/0225090 A1* | 8/2014 | Lee | H01L 27/288 |
| | | | 257/40 |
| 2015/0000745 A1 | 1/2015 | Hayakawa et al. | |
| 2016/0087116 A1* | 3/2016 | Chen | H01L 27/288 |
| | | | 257/84 |
| 2016/0268315 A1* | 9/2016 | Kawata | H01L 29/7869 |

FOREIGN PATENT DOCUMENTS

| | | |
|---|---|---|
| KR | 10-2011-0118459 | 10/2011 |
| KR | 10-2011-0119485 | 11/2011 |
| KR | 10-2014-0050927 | 4/2014 |
| WO | 2013/118794 | 8/2013 |

* cited by examiner

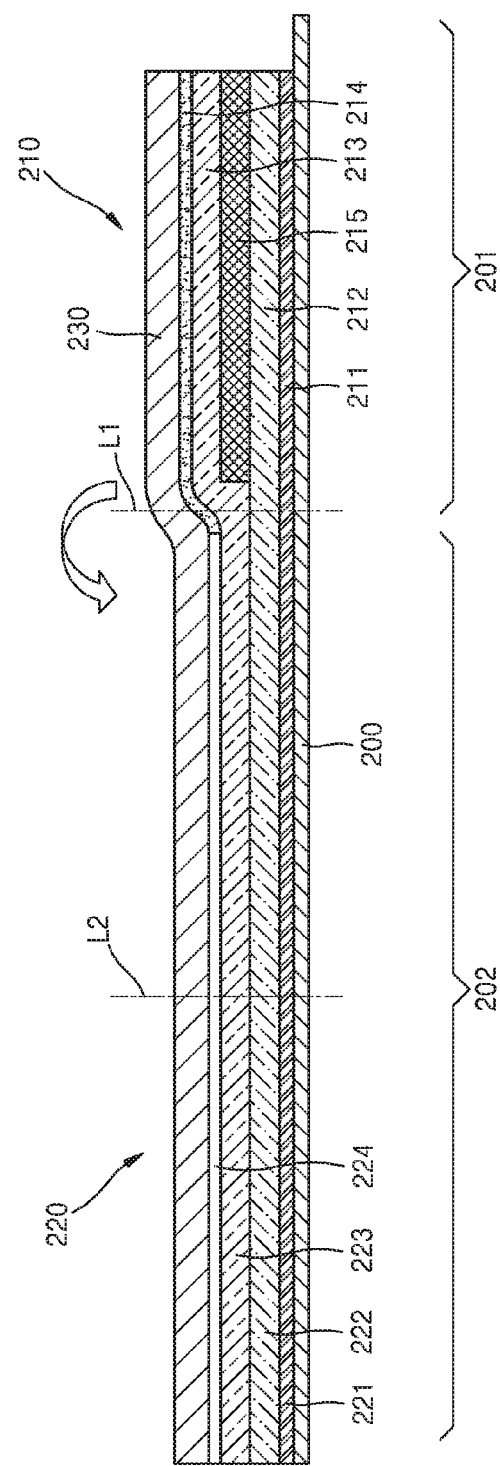

ORGANIC LIGHT-EMITTING DISPLAY DEVICE INCLUDING THIN-FILM SOLAR CELL AND METHOD OF MANUFACTURING THE ORGANIC LIGHT-EMITTING DISPLAY DEVICE

CROSS-REFERENCE TO RELATED APPLICATION

This application claims priority from and the benefit of Korean Patent Application No. 10-2016-0071738, filed on Jun. 9, 2016, which is hereby incorporated by reference for all purposes as if fully set forth herein.

BACKGROUND

Field

The invention relates generally to organic light-emitting display devices, more particularly, to organic light-emitting display devices having an integrated thin-film solar cell and methods of manufacturing organic light-emitting display devices that can simplify the overall manufacturing process.

Discussion of the Background

Generally, an organic light-emitting display device displays images by recombining holes and electrons injected from a positive electrode and a negative electrode in an emission layer, and has a structure in which the emission layer is interposed between the two electrodes.

Recently, as research in light-weighted and flexible thin-film solar cells has been actively conducted, there has been an attempt to provide a multifunctional device by combining a thin-film solar cell with an organic light-emitting display device.

However, when an organic light-emitting display device and a thin-film solar cell are separately fabricated and combined with each other to provide such a multifunctional device, the overall manufacturing process becomes highly complicated.

The above information disclosed in this Background section is only for enhancement of understanding of the background of the inventive concepts, and, therefore, it may contain information that does not form the prior art that is already known in this country to a person of ordinary skill in the art.

SUMMARY

Applicants have recognized a need to provide an integrated, multi-functional organic light-emitting display device and a thin-film solar cell that is less complicated and less costly to make than conventional processes.

Integrated organic light-emitting display devices and thin-film solar cells constructed according to the principles of the invention are fabricated together in a simplified manufacturing process that reduces complexity and costs. For example, manufacturing methods according to the principles the invention may use different areas in the same thin-film layer to provide functions required by the organic light-emitting display device and the thin-film solar cell, respectively.

Additional aspects will be set forth in the detailed description which follows, and, in part, will be apparent from the disclosure, or may be learned by practice of the inventive concepts.

According to one aspect of the invention, an organic light-emitting display device having an integrated thin-film solar cell includes a substrate, a display disposed in a first area on the substrate to display images and including a first thin-film layer, and a thin-film solar cell disposed in a second area on the substrate to receive sunlight and generate electricity to drive the display and including a second thin-film layer. The first thin-film layer and the second thin-film layer include the same thin-film layer extending from the first area to the second area.

The display may include a third thin-film layer and the thin-film solar cell includes a fourth thin-film layer. The third thin-film layer and the fourth thin-film layer may define another thin-film layer extending from the first area to the second area.

The display may include a positive electrode and a negative electrode spaced apart from each other; an emission layer disposed between the positive electrode and the negative electrode; a hole transport layer disposed between the positive electrode and the emission layer; and an electron transport layer disposed between the negative electrode and the emission layer, and the thin-film solar cell may include a first electrode, which includes the same layer as that of the positive electrode; a second electrode, which includes the same layer as that of the negative electrode; a donor layer, which includes the same layer as that of the hole transport layer; and an acceptor layer, which includes the same layer as that of the electron transport layer.

The organic light-emitting display device may further include a buffer film disposed on the negative electrode and the second electrode. The positive electrode and the first electrode may be closer to the substrate than the negative electrode and the second electrode.

The substrate may include a flexible substrate. The flexible substrate may be foldable, such that at least some of the display and the thin-film solar cell overlap each other.

The flexible substrate may be foldable about a boundary line between the first area and the second area, such that one layer of the display and one layer of the thin-film solar cell overlap each other.

The flexible substrate may be foldable in a "U" shape, such that one layer of the display and one layer of the thin-film solar cell face each other.

The positive electrode and the first electrode may include a phototransmissive layer, and the negative electrode, the second electrode, and the buffer film may include an opaque layer.

The flexible substrate may be foldable about a boundary line between the first area and the second area and about a folding line in the second area, such that one layer of the display and a plurality of layers of the thin-film solar cell overlap one another.

The flexible substrate may be foldable in an "e" shape, such that the plurality of layers of the thin-film solar cell faces one another.

The positive electrode, the first electrode, the second electrode, and the buffer film may include phototransmissive layers, and the negative electrode may include an opaque layer.

According to another aspect of the invention, a method of manufacturing an organic light-emitting display device having an integrated thin-film solar cell includes the steps of providing a flexible substrate; forming a display in a first area on the flexible substrate, including a first thin-film layer; forming a thin-film solar cell in a second area on the flexible substrate, including a second thin-film layer that includes the same layer as the first thin-film layer; and folding the flexible substrate, such that at least some of the display and the thin-film solar cell overlap each other.

The step of forming the display may include forming the display with a third thin-film layer, and the step of forming the thin-film solar cell may include forming the thin-film solar cell with a fourth thin-film layer integrally with the third thin-film layer.

The step of forming the display may include forming a positive electrode in the first area of the flexible substrate, forming a hole transport layer on the positive electrode, forming an emission layer on the hole transport layer, forming an electron transport layer on the emission layer, and forming a negative electrode on the electron transport layer, and the step of forming the thin-film solar cell may include forming a first electrode, which includes the same layer as that of the positive electrode, in the second area of the flexible substrate; forming a donor layer, which includes the same layer as that of the hole transport layer; forming an acceptor layer, which includes the same layer as that of the electron transport layer; and forming a second electrode, which includes the same layer as that of the negative electrode.

The method may further include forming a buffer film on the negative electrode and the second electrode.

The step of folding the flexible substrate may include folding the flexible substrate about a boundary line between the first area and the second area, such that one layer of the display and one layer of the thin-film solar cell overlap each other.

The step of folding the flexible substrate may include folding the flexible substrate in a "U" shape, such that one layer of the display and one layer of the thin-film solar cell face each other.

The positive electrode and the first electrode may include a phototransmissive layer, and the negative electrode, the second electrode, and the buffer film may include opaque layers.

The step of folding the flexible substrate may include folding the flexible substrate about a boundary line between the first area and the second area and about a folding line in the second area, such that one layer of the display and a plurality of layers of the thin-film solar cell overlap one another.

The step of folding the flexible substrate may include folding the flexible substrate in an "e" shape, such that the plurality of layers of the thin-film solar cell faces one another.

The positive electrode, the first electrode, the second electrode, and the buffer film may include phototransmissive layers, and the negative electrode may include an opaque layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 5 is a schematic cross-sectional view of the organic light-emitting display device of FIG. 4 in an unfolded configuration.

DETAILED DESCRIPTION OF THE ILLUSTRATED EMBODIMENTS

Figure 1:
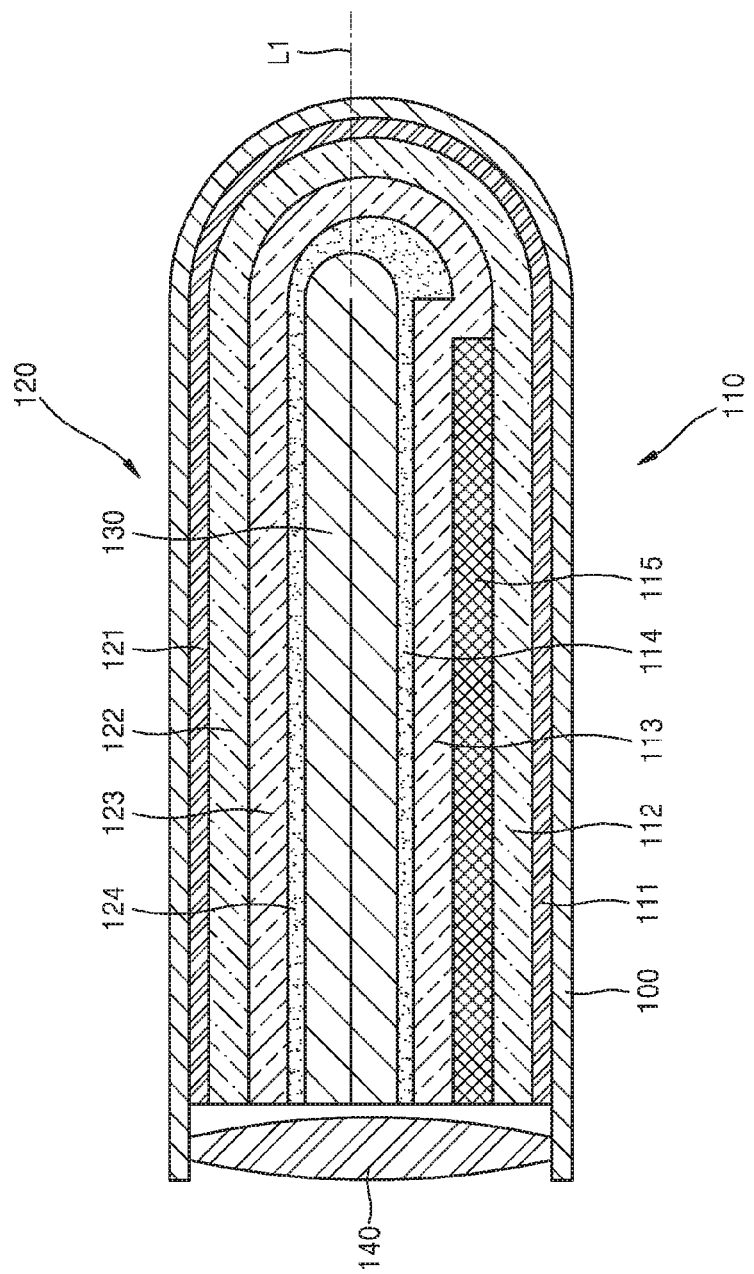
FIG. 1 is a schematic cross-sectional view of an embodiment of an organic light-emitting display device having an integrated thin-film solar cell constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
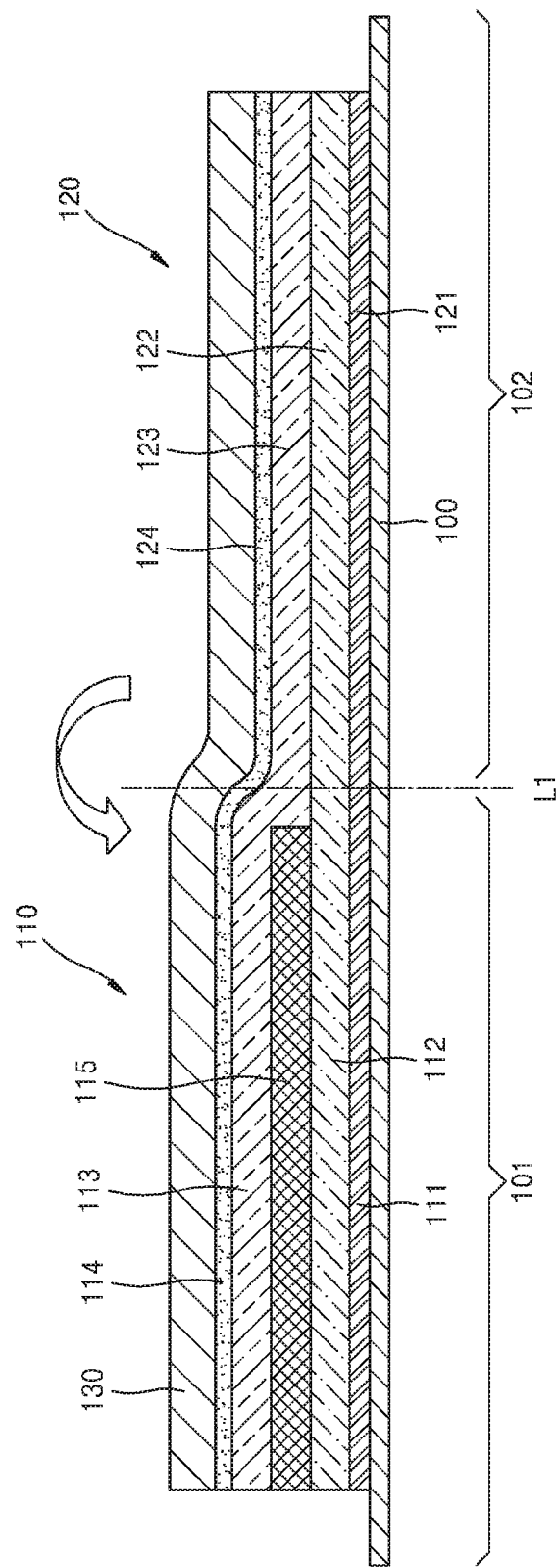
FIG. 2 is a schematic cross-sectional view of the organic light-emitting display device of FIG. 1 in an unfolded configuration.

FIG. 1 is a schematic cross-sectional view of an embodiment of an organic light-emitting display device having an integrated thin-film solar cell constructed according to the principles of the invention, and FIG. 2 is a schematic cross-sectional view of the organic light-emitting display device of FIG. 1 is in an unfolded configuration.

Figure 3:
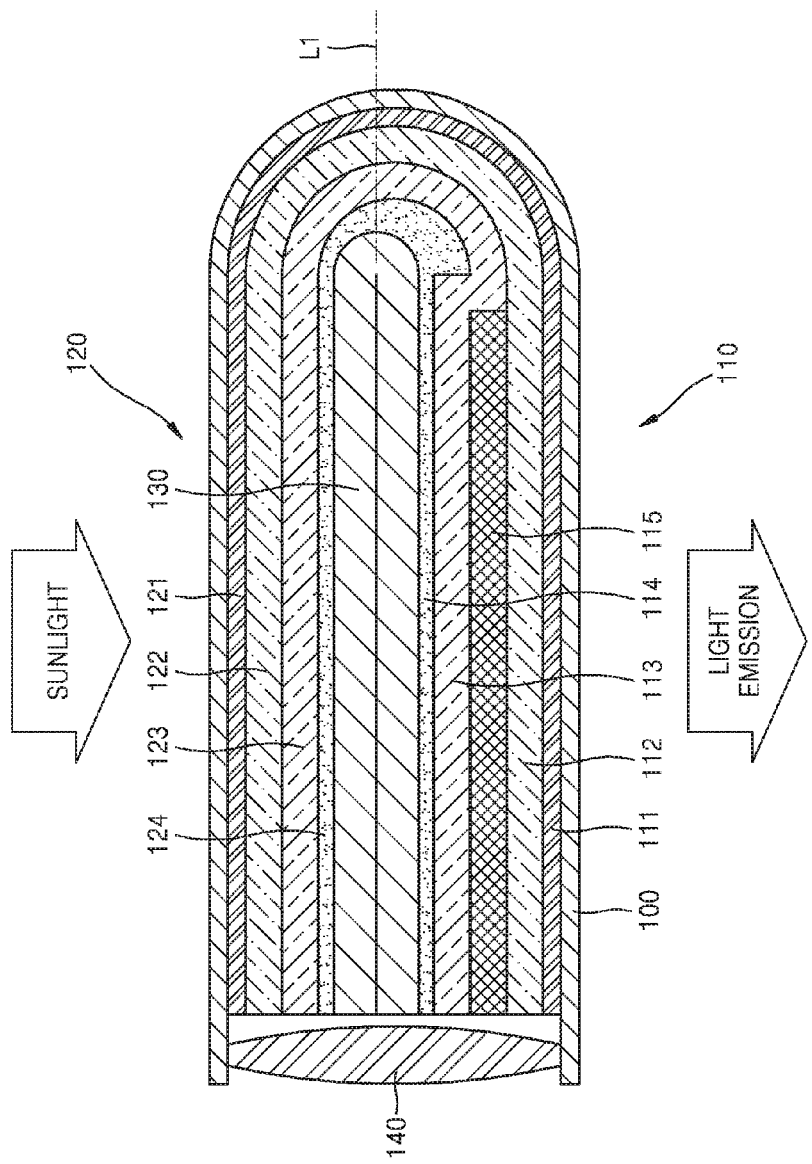
FIG. 3 is a schematic cross-sectional view of the organic light-emitting display device of FIG. 1 in a folded configuration showing how the display and thin-film solar cell in the organic light-emitting display device of FIG. 1 operate independently.

As shown in FIGS. 1 and 2, an integrated organic light-emitting display and thin-film solar cell device includes a display 110 configured to form images, which is an original function of the organic light-emitting display device, and a thin-film solar cell 120 configured to receive sunlight and generate electricity. The organic light-emitting display device is configured to be folded, and the display 110 and the thin-film solar cell overlap each other on a flexible substrate 100. In other words, after forming the display 110 and the thin-film solar cell 120 in different areas on the flexible substrate 100 that may be folded, the flexible substrate 100 is folded in a U shape and sealed by a sealant 140. As a result, as schematically shown in FIG. 3, the thin-film solar cell 120 receives sunlight, generates electricity, and charges the thin-film solar cell 120. The display 110 receives and uses the charged electricity as a part of its power supply for light emission in order to form an image.

The structure of the organic light-emitting display device according to the inventive concepts will be described subsequently in detail with reference to FIG. 2. As described above, FIG. 2 shows a condition in which the integrated organic light-emitting display device is unfolded. When respective thin-film layers of the display 110 and the thin-film solar cell 120 are sequentially formed, the thin-film layers are fabricated in such an unfolded configuration. Once the thin-film layers are folded about a boundary line L1 and sealed by the sealant 140, the structure as shown in FIG. 1 is completed.

First, the display 110 and the thin-film solar cell 120 are formed respectively in a first area 101 and a second area 102 adjacent to each other on the flexible substrate 100.

As shown in FIG. 2, the respective thin-film layers of the thin-film solar cell 120 are not formed separately, but the thin-film layers of the display 110 in the first area 101 extend seamlessly to the second area 102 where they constitute the thin-film layers of the thin-film solar cell 120. In other words, the thin-film solar cell 120 is fabricated together with the display 110 without a separate fabricating process.

In detail, a positive electrode 111 of the display 110 and a first electrode 121 of the thin-film solar cell 120 are formed on the flexible substrate 100. Here, the positive electrode 111 and the first electrode 121 are not different layers, but constitute a single layer having substantially the same material. The positive electrode 111 and the first electrode 121 include a phototransmissive layer such as an ITO layer. Here, the phototransmissive layer refers to a layer through which light may be transmitted including a transparent or translucent layer. When folded as shown in FIG. 1, the positive electrode 111 becomes an outlet through which light from the display 110 is emitted, and the first electrode 121 becomes an inlet through which sunlight is received by the thin-film solar cell 120. Therefore, the positive electrode 111 and the first electrode 121 include a phototransmissive layer. The flexible substrate 100 may also include a phototransmissive layer.

A hole transport layer 112 and a donor layer 122 are formed on the positive electrode 111 and the first electrode 121, respectively. The hole transport layer 112 and the donor layer 122 also are not separate thin-film layers, but rather the hole transport layer 112 of the display 110 in the first area 101 extends seamlessly to the second area 102 where it constitutes the donor layer 122 of the thin-film solar cell 120. The hole transport layer 112 and the donor layer 122 may be formed by applying or depositing a porphyrin-based polymer material or a conjugated polymer material.

An emission layer 115 is formed on the hole transport layer 112 of the display 110. The emission layer 115 is a core thin-film layer that emits light for image formation in the display 110, and the emission layer 115 is not necessary in the thin-film solar cell 120. Therefore, the emission layer 115 is only formed in the display 110 in the first area 101 and is not formed in the thin-film solar cell 120 in the second area 102. The emission layer 115 may include an organic compound having an emission material.

An electron transport layer 113 is formed on the emission layer 115 of the display 110, and an acceptor layer 123 is formed on the donor layer 122 of the thin-film solar cell 120. The electron transport layer 113 of the display 110 in the first area 101 extends seamlessly to the second area 102 where it constitutes the acceptor layer 123 of the thin-film solar cell 120. The electron transport layer 113 and the acceptor layer 123 may include a fullerene-based material.

A negative electrode 114 and a second electrode 124 are formed on the electron transport layer 113 and the acceptor layer 123. The negative electrode 114 and the second electrode 124 may include a metal opaque layer. The negative electrode 114 of the display 110 in the first area 101 extends seamlessly to the second area 102 where it constitutes the second electrode 124 of the thin-film solar cell 120.

Furthermore, a buffer film 130, which includes at least one of $SiO_2$ and $Al_2O_3$ and is an opaque layer, may be formed on the negative electrode 114 and the second electrode 124.

After the thin-film layers of the display 110 and the thin-film solar cell 120 are formed as described above and the flexible substrate 100 is folded about the boundary line L1, a folded structure in a U shape is provided as shown in FIG. 3. In this state, when sunlight enters the thin-film solar cell 120, electricity is generated. When the display 110 is operated to receive the generated electricity as a part of its power supply, light emission occurs.

Light is emitted by the display 110 as holes and electrons injected by the positive electrode 111 and the negative electrode 114 and transferred through the hole transport layer 112 and the electron transport layer 113, and are recombined with each other in the emission layer 115 and emit light, as is known in the art.

Electricity is generated by the thin-film solar cell 120 as is known in the art according to the photovoltaic effect. In other words, when sunlight enters the thin-film solar cell 120 and photons are absorbed, hole-electron pairs are generated in the donor layer 122 and move. At an interface between the donor layer 122 and the acceptor layer 123, electrons of the hole-electron pairs move to the acceptor layer 123 and holes of the hole-electron pairs move to the donor layer 122, thereby causing a potential difference. As a result, the photovoltaic effect occurs. In other words, there is a flow of charge. Here, when a storage battery is connected to the first and second electrodes 121 and 124, charging occurs.

Since the display 110 and the thin-film solar cell 120 overlap each other when folded, the integrated organic light-emitting display device has a very compact structure. Furthermore, since the display 110 and the thin-film solar cell 120 are fabricated together, the overall manufacturing process may be simplified, and costs reduced.

The process for manufacturing the organic light-emitting display device will be described below with reference to FIG. 2.

First, the flexible substrate 100 that may be folded is provided. The positive electrode 111 and the first electrode 121, which are phototransmissive layers, are formed on the flexible substrate 100 in the first area 101 and the second area 102, respectively by known deposition or other semiconductor processing step. In this manner, the positive electrode 111 and the first electrode 121 are integrally formed in the same manufacturing step and constitute the same layer.

Next, the hole transport layer 112 and the donor layer 122 are integrally formed on the positive electrode 111 and the first electrode 121 in the same processing step, and constitute the same layer.

Next, the emission layer 115 is formed on the hole transport layer 112 of the display 110, and the electron transport layer 113 and the acceptor layer 123 are formed on the emission layer 115 of the first area 101 and the donor layer 122 of the second area 102, where the electron transport layer 113 and the acceptor layer 123 are integrally formed to constitute the same layer.

The negative electrode 114 and the second electrode 124 are integrally formed on the electron transport layer 113 and the acceptor layer 123, and constitute the same layer. The buffer film 130 is formed thereon.

When the flexible substrate 100 is folded about the boundary line L1 between the display 110 and the thin-film solar cell 120, and sealed with the sealant 140, an integrated organic light-emitting display device that may be charged and emit light is manufactured as shown in FIG. 3. In other words, the integrated device is a multifunctional organic light-emitting display device that may be easily manufactured and has a charging function and light-emitting function.

While the above-described exemplary embodiment has a structure that is folded in a U shape so that one layer of the display 110 and one layer of the thin-film solar cell 120 face each other in a one-to-one manner, other shapes are possible. For example, as shown in FIG. 4, the thin-film solar cell 120 portion of the integrate device may be folded in an e shape, such that s a plurality of layers faces one another.

Figure 4:
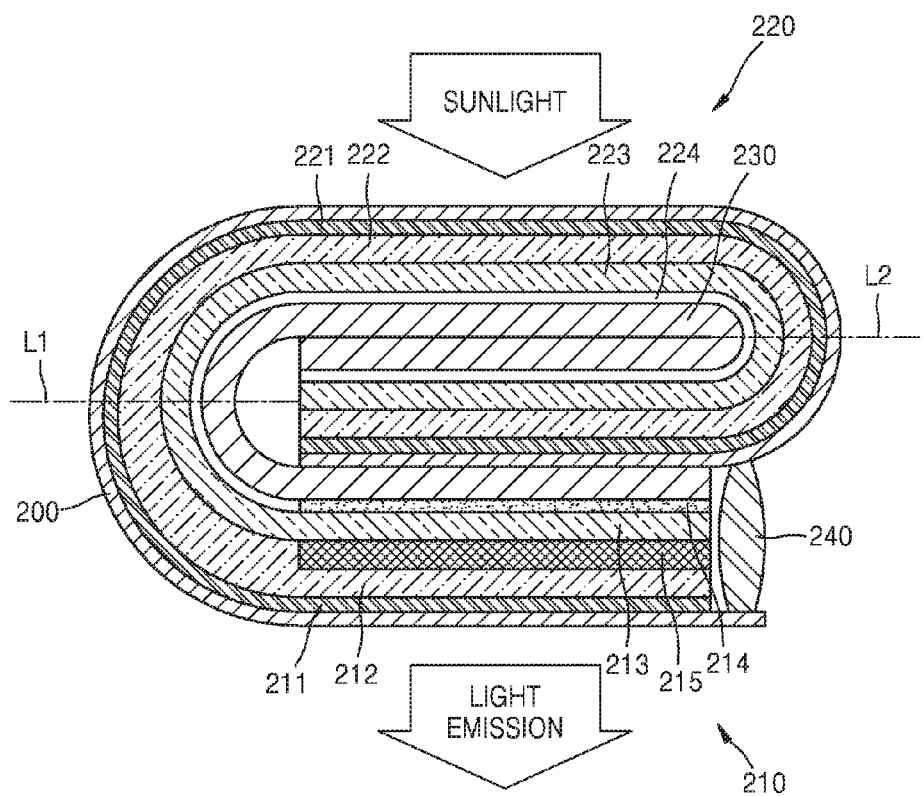
FIG. 4 is a schematic cross-sectional view of another embodiment of an organic light-emitting display device having an integrated thin-film solar cell constructed according to the principles of the invention.

FIG. 4 is a schematic cross-sectional view of another embodiment of an organic light-emitting display device having an integrated thin-film solar cell constructed according to the principles of the invention. FIG. 5 is a schematic cross-sectional view of the organic light-emitting display device of FIG. 4 in an unfolded configuration.

The basic structure of the organic light-emitting display device according to this embodiment is similar to that of the above-stated embodiment. Referring to FIG. 5, a display 210 and a thin-film solar cell 220 are disposed on a flexible substrate 200 in a first area 201 and in a second area 202, respectively. The display 210 includes a stack of a positive electrode 211, a hole transport layer 212, an emission layer 215, an electron transport layer 213, and a negative electrode 214. The thin-film solar cell 220 includes a stack defined by a first electrode 221 which constitutes the same layer as the positive electrode 211, a donor layer 222, which constitutes the same layer with the hole transport layer 212, an acceptor layer 223, which constitutes the same layer with the hole transport layer 213, and a second electrode 224, which constitutes the same layer with the negative electrode 214. A buffer film 230 covers the display 210 and the thin-film solar cell 220. Reference numeral 240 denotes a sealant.

Therefore, the basic structure of the integrated organic light-emitting display device according to this embodiment is similar to that of the integrated organic light-emitting display device according to the above-stated embodiment, except that the second electrode 224 and the buffer film 230 include phototransmissive layers. In other words, the second electrode 224 is disposed on the same layer as the negative electrode 214, but the second electrode 224 includes a translucent layer having a material such as MgAg unlike an opaque material constituting the negative electrode 214. Furthermore, the buffer film 230 includes a phototransmissive layer, such as a polyethylene terephthalate (PET) layer or a polycarbonate (PC) layer. The reason that the second electrode 224 and the buffer layer 230 are formed as phototransmissive layers is to allow sunlight to reach the donor layer 222 inside the thin-film solar cell 220 well when the thin-film solar cell 220 is folded to form a plurality of layers as shown in FIG. 4. In other words, when the flexible substrate 200 is folded in an e shape as shown in FIG. 4 not only about the boundary line L1, but also about a folding line L2 in the thin-film solar cell 220, the thin-film solar cell 220 is folded into a plurality of layers. Here, when the buffer layer 230 and the second electrode 224 are opaque layers, photons may be absorbed only by the outermost portion of the donor layer 222, and thus charging efficiency is lowered. However, when the buffer layer 230 and the second electrode 224 are formed as phototransmissive layers, photons may reach not only the outer portion of the donor layer 222, but also the inner portion of the donor layer 222. Therefore, charging efficiency may be improved. In other words, when it is desired to improve charging efficiency, the thin-film solar cell 220 may be fabricated into a longer shape and folded into a plurality of layers as in this embodiment. Here, layers via which sunlight enters may be provided as phototransmissive layers, such that photons may be distributed throughout the donor layer 222 including a plurality of layers.

Therefore, according to this embodiment, a structure with further improved charging efficiency as compared to that of the above-described embodiment of FIGS. 1-3 may be embodied.

Therefore, according to the principles of the invention described above, a thin-film solar cell may be fabricated integrally with an organic light-emitting display device, i.e., while the organic light-emitting display device is being fabricated, thereby simplifying the overall manufacturing process and significantly improving productivity and reducing costs. Furthermore, since the organic light-emitting display device may be folded such that the thin-film solar cell and a display overlap each other, the organic light-emitting display device may become very compact.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. An organic light-emitting display device having an integrated thin-film solar cell, the organic light-emitting display device comprising:
a substrate;
a display disposed in a first area on the substrate to display images and including a first thin-film layer; and
a thin-film solar cell disposed in a second area on the substrate to receive sunlight and generate electricity to drive the display and including a second thin-film layer, wherein the first thin-film layer and the second thin-film layer comprise the same thin-film layer extending from the first area to the second area.

2. The organic light-emitting display device of claim 1, wherein the display includes a third thin-film layer and the thin-film solar cell includes a fourth thin-film layer,
wherein the third thin-film layer and the fourth thin-film layer define another thin-film layer extending from the first area to the second area.

3. The organic light-emitting display device of claim 1, wherein:
the display comprises a positive electrode and a negative electrode spaced apart from each other; an emission layer disposed between the positive electrode and the negative electrode; a hole transport layer disposed between the positive electrode and the emission layer; and an electron transport layer disposed between the negative electrode and the emission layer, and
the thin-film solar cell comprises a first electrode, which comprises the same layer as that of the positive electrode; a second electrode, which comprises the same layer as that of the negative electrode; a donor layer, which comprises the same layer as that of the hole transport layer; and an acceptor layer, which comprises the same layer as that of the electron transport layer.

4. The organic light-emitting display device of claim 3, further comprising a buffer film disposed on the negative electrode and the second electrode, and
wherein the positive electrode and the first electrode are closer to the substrate than the negative electrode and the second electrode.

5. The organic light-emitting display device of claim 4, wherein the substrate comprises a flexible substrate,
wherein the flexible substrate is foldable, such that at least some of the display and the thin-film solar cell overlap each other.

6. The organic light-emitting display device of claim 5, wherein the flexible substrate is foldable about a boundary line between the first area and the second area, such that one layer of the display and one layer of the thin-film solar cell overlap each other.

7. The organic light-emitting display device of claim 6, wherein the flexible substrate is foldable in a "U" shape, such that one layer of the display and one layer of the thin-film solar cell face each other.

8. The organic light-emitting display device of claim 6, wherein:
the positive electrode and the first electrode comprise a phototransmissive layer, and
the negative electrode, the second electrode, and the buffer film comprise an opaque layer.

9. The organic light-emitting display device of claim 5, wherein the flexible substrate is foldable about a boundary line between the first area and the second area and about a folding line in the second area, such that one layer of the display and a plurality of layers of the thin-film solar cell overlap one another.

10. The organic light-emitting display device of claim 9, wherein the flexible substrate is foldable in an "e" shape, such that the plurality of layers of the thin-film solar cells face one another.

11. The organic light-emitting display device of claim 9, wherein:
the positive electrode, the first electrode, the second electrode, and the buffer film comprise phototransmissive layers, and
the negative electrode comprises an opaque layer.

12. A method of manufacturing an organic light-emitting display device having an integrated thin-film solar cell, the method comprising the steps of:
providing a flexible substrate;
forming a display in a first area on the flexible substrate, including a first thin-film layer;
forming a thin-film solar cell in a second area on the flexible substrate, including a second thin-film layer that comprises the same layer as the first thin-film layer; and
folding the flexible substrate, such that at least some of the display and the thin-film solar cell overlap each other.

13. The method of claim 12, wherein:
the step of forming the display comprises forming the display with a third thin-film layer, and the step of forming the thin-film solar cell comprises forming the thin-film solar cell with a fourth thin-film layer integrally with the third thin-film layer.

14. The method of claim 12, wherein:
the step of forming the display comprises forming a positive electrode in the first area of the flexible substrate; forming a hole transport layer on the positive electrode; forming an emission layer on the hole transport layer; forming an electron transport layer on the emission layer; and forming a negative electrode on the electron transport layer, and
the step of forming the thin-film solar cell comprises forming a first electrode, which comprises the same layer as that of the positive electrode, in the second area of the flexible substrate; forming a donor layer, which comprises the same layer as that of the hole transport layer; forming an acceptor layer, which comprises the same layer as that of the electron transport layer; and forming a second electrode, which comprises the same layer as that of the negative electrode.

15. The method of claim 14, the method further comprising forming a buffer film on the negative electrode and the second electrode.

16. The method of claim 14, wherein the step of folding the flexible substrate comprises folding the flexible substrate about a boundary line between the first area and the second area, such that one layer of the display and one layer of the thin-film solar cell overlap each other.

17. The method of claim 16, wherein the step of folding the flexible substrate comprises folding the flexible substrate in a "U" shape, such that one layer of the display and one layer of the thin-film solar cell face each other.

18. The method of claim 16, wherein:
the positive electrode and the first electrode comprise a phototransmissive layer, and
the negative electrode, the second electrode, and the buffer film comprise opaque layers.

19. The method of claim 14, wherein the step of folding the flexible substrate comprises folding the flexible substrate about a boundary line between the first area and the second area and about a folding line in the second area, such that one layer of the display and a plurality of layers of the thin-film solar cell overlap one another.

20. The method of claim 19, wherein the step of folding the flexible substrate comprises folding the flexible substrate in an "e" shape, such that the plurality of layers of the thin-film solar cell faces one another.

21. The method of claim 19, wherein:
the positive electrode, the first electrode, the second electrode, and the buffer film comprise phototransmissive layers, and
the negative electrode comprises an opaque layer.

* * * * *